(12) United States Patent
Tamura

(10) Patent No.: US 12,742,799 B2
(45) Date of Patent: Sep. 22, 2026

(54) CURRENT SENSOR

(71) Applicant: Alps Alpine Co., Ltd., Tokyo (JP)

(72) Inventor: Manabu Tamura, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 145 days.

(21) Appl. No.: 18/921,175

(22) Filed: Oct. 21, 2024

(65) Prior Publication Data

US 2025/0044325 A1 Feb. 6, 2025

Related U.S. Application Data

(63) Continuation of application No. PCT/JP2023/006378, filed on Feb. 22, 2023.

(30) Foreign Application Priority Data

May 11, 2022 (JP) ................................ 2022-078074

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC .......................... G01R 15/207; G01R 19/0092
See application file for complete search history.

(56) References Cited

FOREIGN PATENT DOCUMENTS

| | | | | |
|---|---|---|---|---|
| CN | 116449073 A | * | 7/2023 | ............ G01R 19/00 |
| JP | 2010-223868 A | | 10/2010 | |
| JP | 2012-242176 A | | 12/2012 | |
| JP | 2017-44486 A | | 3/2017 | |
| JP | 2021-107800 A | | 7/2021 | |
| WO | 2018-159229 A1 | | 9/2018 | |

* cited by examiner

*Primary Examiner* — Minh Q Phan
(74) *Attorney, Agent, or Firm* — Harness, Dickey & Pierce, P.L.C.

(57) ABSTRACT

A current sensor has: a bus bar extending in a first direction; a magnetic shield having a portion that faces the bus bar along a third direction; a magnetic sensor facing the bus bar along the third direction on an opposite side of the bus bar to a side on which the magnetic shield is placed; and a case molded integrally with part of the bus bar. The magnetic shield has: a U-shaped portion that has a bottom wall including a portion that faces the bus bar along the third direction and also has two side walls, facing each other in the second direction, that is erected in the third direction from ends of the bottom wall in a second direction; an attachment portion that is adjoined to the U-shaped portion and is fixed to the case; and a link portion that links the U-shaped portion and attachment portion together.

12 Claims, 13 Drawing Sheets

31
31B
30a
10
20
31W
31W
33
32
Y1
X2
X1
Y2

CURRENT SENSOR

CLAIM OF PRIORITY

This application is a Continuation of International Application No. PCT/JP2023/006378 filed on Feb. 22, 2023, which claims benefit of Japanese Patent Application No. 2022-078074 filed on May 11, 2022. The entire contents of each application noted above are hereby incorporated by reference.

BACKGROUND OF THE INVENTION

1. Field of the Invention

The present invention relates to a current sensor having a U-shaped magnetic shield.

2. Description of the Related Art

With a current sensor that measures the amount of current flowing in a bus bar by using a magnetic sensor, a magnetic shield mat be provided to reduce the effect of an external magnetic field on the magnetic sensor. Magnetic shields the cross sections of which are U-shaped (that is, U-shaped magnetic shields) are disclosed in, for example, Japanese Unexamined Patent Application Publication No. 2010-223868, International Publication No. WO2018-159229, and Japanese Unexamined Patent Application Publication No. 2021-107800.

To assure measurement precision of a current sensor, it is important that the relative position of the magnetic shield to the bus bar and magnetic sensor be appropriately set, regardless of the shape of the magnetic shield. In general, the magnetic sensor is disposed on a substrate and a portion, facing the magnetic sensor, of the bus bar is in a flat-plate shape, so the U-shaped magnetic shield has a three-dimensional shape, unlike other members included in the current sensor. Thus, various considerations are being made to appropriately fix the U-shaped magnetic shield to a case. In Japanese Unexamined Patent Application Publication No. 2010-223868, for example, a through-hole is formed in the bottom wall of a U-shaped magnetic shield, and a projection formed on a resin housing is inserted into this through-hole, after which the projection projecting from the through-hole is thermally fused and is then naturally cooled so that the U-shaped magnetic shield is fixed to the housing. In International Publication No. WO2018-159229, a support member formed from an insulating material such as a resin material is provided between a sensor substrate and a main substrate, and a magnetic shield is fitted into a recess formed in this support member. In Japanese Unexamined Patent Application Publication No. 2021-107800, a U-shaped magnetic shield is fixed to a substrate by a resin portion, which covers the bottom wall of the U-shaped magnetic shield, and a shield fixing portion having legs extending from the resin portion along side walls and also having claws provided at the ends of the legs to catch the substrate.

In the structure disclosed in Japanese Unexamined Patent Application Publication No. 2010-223868, a through-hole to attenuate an external magnetic field is formed in part of the magnetic shield, so it is feared that the external magnetic field attenuation function is affected. In the structures disclosed in International Publication No. WO2018-159229 and Japanese Unexamined Patent Application Publication No. 2021-107800, the possibility cannot be eliminated that a deviation occurs between the magnetic shield and the resin portion that holds the magnetic shield.

SUMMARY OF THE INVENTION

The present invention provides a current sensor, having a U-shaped magnetic shield, in which the U-shaped magnetic shield can be fixed to a case with high positional precision, without effects on an external magnetic field attenuation function of the U-shaped magnetic shield.

A current sensor in one aspect of the present invention that addresses the above problem has, when three directions that are mutually orthogonal are a first direction, a second direction, and a third direction, a bus bar extending in the first direction, a magnetic shield having a portion that faces the bus bar along the third direction, a magnetic sensor that faces the bus bar along the third direction on an opposite side of the bus bar to a side on which the magnetic shield is placed, and a case molded integrally with part of the bus bar. The magnetic shield has: a U-shaped portion that has a bottom wall including a portion that faces the bus bar along the third direction and also has two side walls that are erected in the third direction from ends of the bottom wall in the second direction and are placed so as to face each other in the second direction; an attachment portion that is adjoined to the U-shaped portion and is fixed to the case; and a link portion that links the U-shaped portion and the attachment portion together.

The attachment portion adjoined to the U-shaped portion is used to fix a relative position of the U-shaped portion, which mainly fulfills an external magnetic field attenuation function in the magnetic shield, to the case, that is, to attach the U-shaped portion to the case. Therefore, the U-shaped portion can take a shape specialized to the external magnetic field attenuation function. In addition, the attachment portion can be specialized to a function for fixing to the case, so the magnetic shield can be placed with high precision. Thus, improvement in measurement precision can be expected for the magnetic sensor.

In the current sensor described above, the attachment portion may be disposed from the link portion positioned at an end of the bottom wall of the U-shaped portion in the first direction. In this situation, the side wall of the U-shaped portion or part of the side wall can be formed by bending part of a single metal plate. The bottom wall of the U-shaped portion or part of the bottom wall as well as the link portion and attachment portion can be formed from a portion remaining in a flat plate shape. Therefore, the magnetic shield can be efficiently formed.

In the current sensor described above, a plurality of bus bars may be provided side by side in the case in the second direction. In this situation, the magnetic shield preferably has a plurality of U-shaped portions in correspondence to the plurality of bus bars. The plurality of U-shaped portions are preferably adjoined to an attachment portion shared by them.

Since a plurality of U-shaped portions are adjoined to a single attachment portion, when the attachment portion is positioned the plurality of U-shaped portions can be precisely positioned concurrently. Since the plurality of U-shaped portions are integrated together through the attachment portion, relative positional deviations of the plurality of U-shaped portions are less likely to occur. Furthermore, the plurality of U-shaped portions can be attached in a single attachment process.

In the current sensor, described above, that has the magnetic shield having a plurality of U-shaped portions, two U-shaped portions corresponding to two bus bars adjacent to each other may be placed with an offset in the first direction. Furthermore, the two U-shaped portions corresponding to the two bus bars adjacent to each other may partially overlap each other when viewed along the first direction. In this type of placement, spacing can be narrowed between the two adjacent bus bars in the second direction.

In the current sensor described above, the attachment portion may be formed from a soft magnetic body and may be placed so as to be positioned between the U-shaped portion and a magnetic noise generation source or may be adjoined to each of both ends of the U-shaped portion in the first direction. Since the attachment portion is formed from a soft magnetic body, the attachment portion can fulfill an external magnetic field attenuation function.

The current sensor described above may further have a cover, for the case, that abuts the case from the third direction. Since the cover is disposed, entrance of foreign matter into the case is stably prevented. Even if rust is caused from a member included in the magnetic shield (particularly, from a broken surface after a metal plate has been cut), the rust is less likely to be expelled to the outside of the current sensor. This prevents rust-caused problems, specific examples of which are a short-circuit and the like.

In the current sensor described above, the magnetic shield may be formed from a metal plate, and the side wall of the U-shaped portion may be formed by bending part of the metal plate. This type of magnetic shield is superior in productivity and is also superior in quality stability, so the current sensor is expected to be stable in quality.

In the current sensor described above, the U-shaped portion may be a multi-layer body in which a plurality of metal plates are laminated, and the attachment portion may be linked to at least one of the plurality of metal plates through the link portion. In this situation, the attachment portion may be formed from one of the metal plates constituting the multi-layer body, the one being the most distant from the bus bar.

The current sensor described above may have a plurality of magnetic shields. The plurality of magnetic shields may be fixed to the case so that a plurality of bus bars corresponding to a plurality of U-shaped portions included in the plurality of magnetic shields are arranged side by side in the second direction. When, for example, the magnetic shield has three U-shaped portions, the magnetic shield can be positioned as a measurement unit; for example, the magnetic shield is adapted for measurement for three-phase wires, so the current sensor may be designed with greater degrees of freedom.

According to the present invention, a current sensor having a U-shaped magnetic shield is provided. In the current sensor, the U-shaped magnetic shield can be fixed to a case with high positional precision, without effects on an external magnetic field attenuation function of the U-shaped magnetic shield.

DESCRIPTION OF THE PREFERRED EMBODIMENTS

Figure 1A:
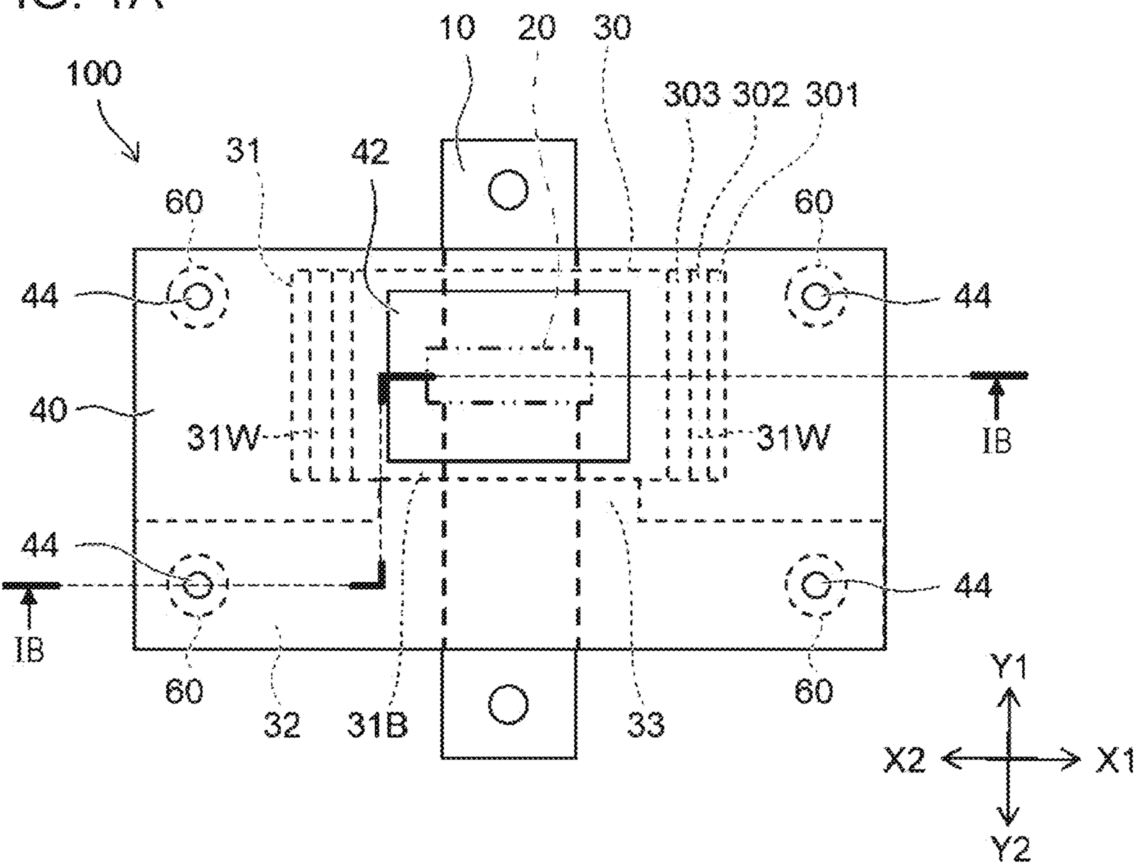
FIG. 1A illustrates a current sensor in a first embodiment of the present invention.

Embodiments of the present invention will be described below with reference to the drawing. In the descriptions below, identical members and the like will be denoted by identical reference characters and descriptions will be appropriately omitted for members and the like that have been described once. In the descriptions below, the Y1-Y2 direction will be defined as a first direction, the X1-X2 direction will be defined as a second direction, and the Z1-Z2 direction will be defined as a third direction. The Z1 side in the Z1-Z2 direction (third direction) may be referred as "upward", and the Z2 side in the Z1-Z2 direction (third direction) may be referred as "downward".

First Embodiment

Figure 1B:
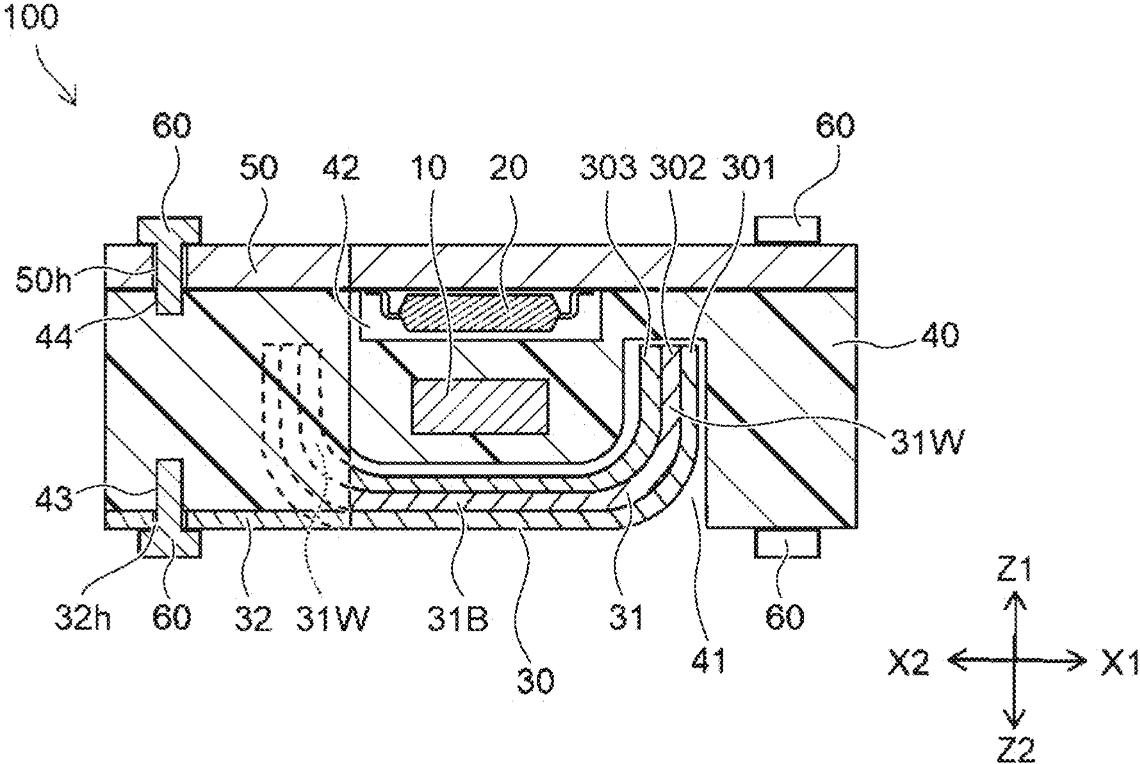
FIG. 1B illustrates a cross section along line IB-IB in FIG. 1A.
Figure 2A:
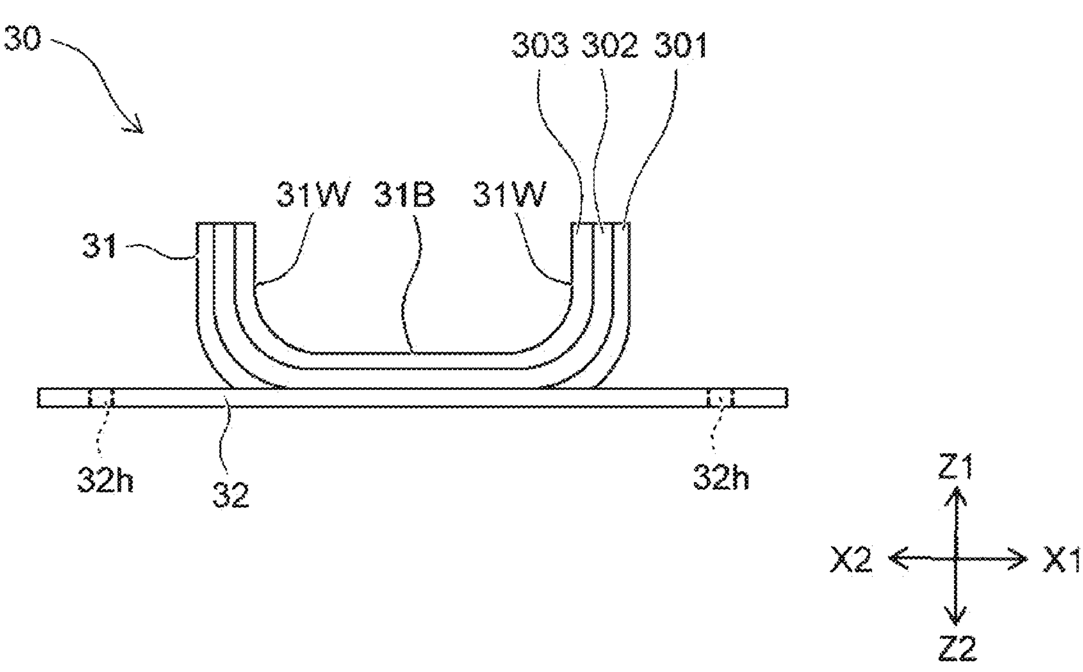
FIG. 2A illustrates a magnetic shield included in the current sensor in the first embodiment of the present invention when viewed along a Y1-Y2 direction (first direction)
Figure 2B:
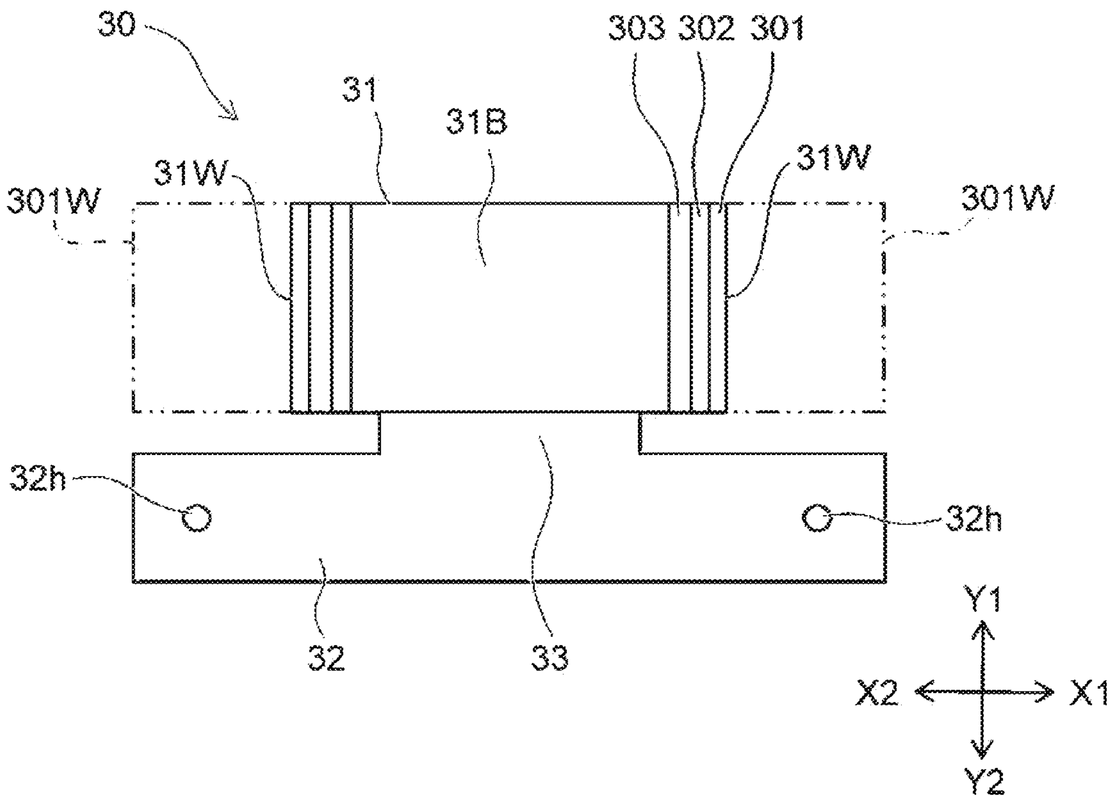
FIG. 2B illustrates the magnetic shield included in the current sensor in the first embodiment of the present invention when viewed along a Z1-Z2 direction (third direction)

FIG. 1A illustrates a current sensor in a first embodiment of the present invention. FIG. 1B illustrates a cross section along line IB-IB in FIG. 1A. Line IB-IB includes two points at which the direction changes. In FIG. 1B, a lid, fixing members, and a substrate are not illustrated to simplify explanation, and a magnetic sensor is indicated by virtual lines. FIG. 2A illustrates a magnetic shield included in the current sensor in the first embodiment of the present invention when viewed along a Y1-Y2 direction (first direction). FIG. 2B illustrates the magnetic shield included in the current sensor in the first embodiment of the present invention when viewed along a Z1-22 direction (third direction).

As illustrated in FIGS. 1A and 1B, the current sensor 100 in the first embodiment of the present invention has a bus bar 10, a magnetic sensor 20, a magnetic shield 30, a case 40, a substrate 50, and fixing members 60. The bus bar 10 extends in the first direction (Y1-Y2 direction). A current under measurement flows in the bus bar 10 in the first direction. Specifically, when, for example, a current flowing from an inverter into a motor is to be measured in an electric vehicle or the like, an end of the bus bar 10 in the first direction is connected to the inverter and another end is connected to the motor. The magnetic sensor 20 has a sensitive axis along the second direction (X1-X2 direction), and faces the bus bar 10 along the third direction (Z1-Z2 direction) crossing (orthogonal to, in this embodiment) the first direction (Y1-Y2 direction). Specifically, the magnetic sensor 20 is placed so as to face the Z1 side of the bus bar 10 in the Z1-22 direction.

As illustrated in FIGS. 2A and 2B, the magnetic shield 30 has a U-shaped portion 31, an attachment portion 32, and a link portion 33 that links the U-shaped portion 31 and attachment portion 32 together. In this embodiment, the magnetic shield 30 is a bent body formed from a metal plate made of a soft magnetic body.

The U-shaped portion 31 has a bottom wall 31B including a portion that faces the bus bar 10 along the third direction (Z1-Z2 direction), and also has two side walls 31W erected along the third direction (Z1-22 direction) from ends of the bottom wall 31B in the second direction (X1-X2 direction) so as to face each other in the second direction (X1-X2 direction). The U shape of the U-shaped portion 31 when viewed along the first direction (Y1-Y2 direction) is formed in this way.

The U-shaped portion 31 can increase measurement precision of the magnetic sensor 20, which detects an induced magnetic field created from the bus bar 10 by attenuating an external magnetic field oriented to the magnetic sensor 20 from the opposite side of the U-shaped portion 31 to its side facing the magnetic sensor 20. Since the cross section of the U-shaped portion 31 is in a U shape and the side wall 31W extends toward the Z1 side in the Z1-22 direction, the U-shaped portion 31 can attenuate not only an external magnetic field from the Z2 side of the bottom wall 31B in the Z1-22 direction but also an external magnetic field from a side of the side wall 31W (on the X1 side in the X1-X2 direction or on the X2 side in the X1-X2 direction).

The bus bar 10 and magnetic sensor 20 are positioned between the two side walls 31W when viewed along the third direction (Z1-22 direction). Since the bus bar 10 is positioned between the two side walls 31W when viewed along the first direction (Y1-Y2 direction), the U-shaped portion 31 can fulfill not only an external magnetic field attenuation function but also the role of a yoke that preferentially passes the induced magnetic field from the bus bar 10.

In this embodiment, when viewed along the first direction (Y1-Y2 direction), the magnetic sensor 20 is not positioned between the two side walls 31W but is positioned slightly above the upper ends (ends on the Z1 side in the Z1-Z2 direction) of the two side walls 31W (see FIG. 1B). In this placement, the induced magnetic field from the bus bar 10 enters a magnetic circuit, in which the induced magnetic field passes through the interior of the U-shaped portion 31, is released from the upper end of one side wall 31W, and enters the interior of the U-shaped portion 31 from the upper end of the other side wall 31W. In a magnetic path, in this magnetic circuit, through which the induced magnetic field is released from the upper end of the one side wall 31W and is oriented toward the upper end of the other side wall 31W, a component passing in the second direction (X1-X2 direction), which is the sensitive axis direction of the magnetic sensor 20, is increased. Therefore, the induced magnetic field from the bus bar 10 is efficiently applied to the magnetic sensor 20.

When viewed along the first direction (Y1-Y2 direction), the magnetic sensor 20 may be positioned between the two side walls 31W. In this placement, it is expected that the external magnetic field attenuation function of the U-shaped portion 31 is particularly enhanced.

In this embodiment, the U-shaped portion 31 is formed by bending three metal plates 301, 302, and 303 that have a soft magnetic property. The U-shaped portion 31 may be a multi-layer body in which two metal plates 302 and 303 are laminated on the metal plate 301 (on the Z1 side in the Z1-Z2 direction) in the Z1-22 direction. The metal plate 302 is placed in a state in which the metal plate 302 is in tight contact with the inner surface of the metal plate 301, and the metal plate 303 is placed in a state in which the metal plate 303 is in tight contact with the inner surface of the metal plate 302. The metal plates 301, 302, and 303 are integrally held by crimping or the like.

Of the three metal plates 301, 302, and 303 constituting the multi-layer body, the metal plate 301, which is the most distant from the bus bar 10 (on the Z2 side in the Z1-Z2 direction), may have the link portion 33 at an end of a portion in the first direction (Y1-Y2 direction), the portion forming the bottom wall 31B of the U-shaped portion 31. The metal plate 301 may have a portion that further extends from the link portion 33 in the first direction (Y1-Y2 direction). This portion may form the attachment portion 32. That is, part of the metal plate 301 may be bent to form part of the U-shaped portion 31, and a portion remaining unbent forms the link portion 33 and attachment portion 32. Since the link portion 33 is present, when the metal plate 301 is bent to erect a portion intended to form the side wall 31W, the possibility is reduced that the portion intended to form the side wall 31W interferes with another portion positioned in the vicinity, so the portion intended to form the side wall 31W is not appropriately erected or an unpredictable deformation occurs in the other portion in the vicinity.

Although, in this embodiment, only the metal plate 301 has the attachment portion 32 and link portion 33, all of the three metal plates 301, 302, and 303 may have the attachment portion 32 and link portion 33. In this situation, it is preferable for the attachment portions 32 and link portions 33 provided for the metal plates 301, 302, and 303 to have the same shape and to be disposed at positions at which they coincide, when viewed in the Z1-22 direction. Alternatively, only the metal plate 302 or metal plate 303 may have the attachment portion 32 and link portion 33. The metal plate 301 is fixed to the case 40 in a state in which the U-shaped portion 31 is inserted into a storage recess 41 formed in the case 40, as illustrated in FIG. 1B. Therefore, in the structure in which only the metal plate 301 has the attachment portion 32 and link portion 33 as in this embodiment, it is possible to minimize an amount by which the U-shaped portion 31 protrudes from the storage recess 41 toward the Z2 side in the Z1-22 direction, so the outside shape of the current sensor 100 in the Z1-22 direction can be made small.

A portion 301W indicated by the virtual lines in FIG. 2B indicates the shape of a portion, which is part of the metal plate 301, of the side wall 31W before the portion is bent. Before the metal plate 301 is bent to form the U-shaped portion 31, the ends of a portion intended to form the U-shaped portion 31 in the X1-X2 direction and the ends of the attachment portion 32 in the X1-X2 direction are at the same positions in the X1-X2 direction, as indicated by the shape of this portion 301W. Therefore, waste of materials is small when the metal plate 301 is machined.

The attachment portion 32 is adjoined to the U-shaped portion 31 through the link portion 33, and fixing to the case 40 is performed at the attachment portion 32. In this embodiment, a plurality of through-holes 32*h* (two through-holes 32*h* in this embodiment) are formed in the attachment portion 32. When the fixing members 60 are passed through these through-holes 32*h* and are fixed to the case 40, the attachment portion 32 is fixed to the case 40. A specific example of the fixing member 60 is a screw or a bolt.

The case 40 is formed from, for example a resin material. Part of the bus bar 10 is embedded in the case 40 by, for example, insert molding. The storage recess 41, in which the U-shaped portion 31 is stored, is formed on the lower side (Z2 side in the Z1-22 direction) of the case 40, the storage recess 41 being recessed so as to match the shape of the U-shaped portion 31. Furthermore, on the lower side (Z2 side in the Z1-22 direction) of the case 40, fixing holes 43 are formed that accept the fixing members 60 passed through the through-holes 32*h* in the attachment portion 32 so that a state in which the U-shaped portion 31 placed in the interior of the storage recess 41 is held. In the fixing of the attachment portion 32 to the case 40 with the fixing members 60, a member in a flat plate shape (attachment portion 32) is fixed to a flat pate (the lower surface of the case 40), positioning precision is easily enhanced. In contrast to this, the U-shaped portion 31 having a three-dimensional shape is not easily positioned accurately in the interior of the storage recess 41. Therefore, when the attachment portion 32 is positioned and fixed to the case 40, the U-shaped portion 31 adjoined to the attachment portion 32 through the link portion 33 can be accurately positioned to the case 40.

A cavity 42 and fixing holes 44 are formed on the upper side (the Z1 side in the Z1-22 direction) of the case 40, the cavity 42 being used to store the magnetic sensor 20 fixed to the substrate 50, the fixing holes 44 being used to fix the substrate 50. Since the magnetic sensor 20 has been positioned and fixed to the substrate 50, when the fixing members 60 are passed through through-holes 50*h* in the substrate 50 and are fixed to the fixing holes 44, the magnetic sensor 20 is accurately positioned to the case 40. The cavity 42 becomes closed space covered with the substrate 50.

Figures 3A, 3B:
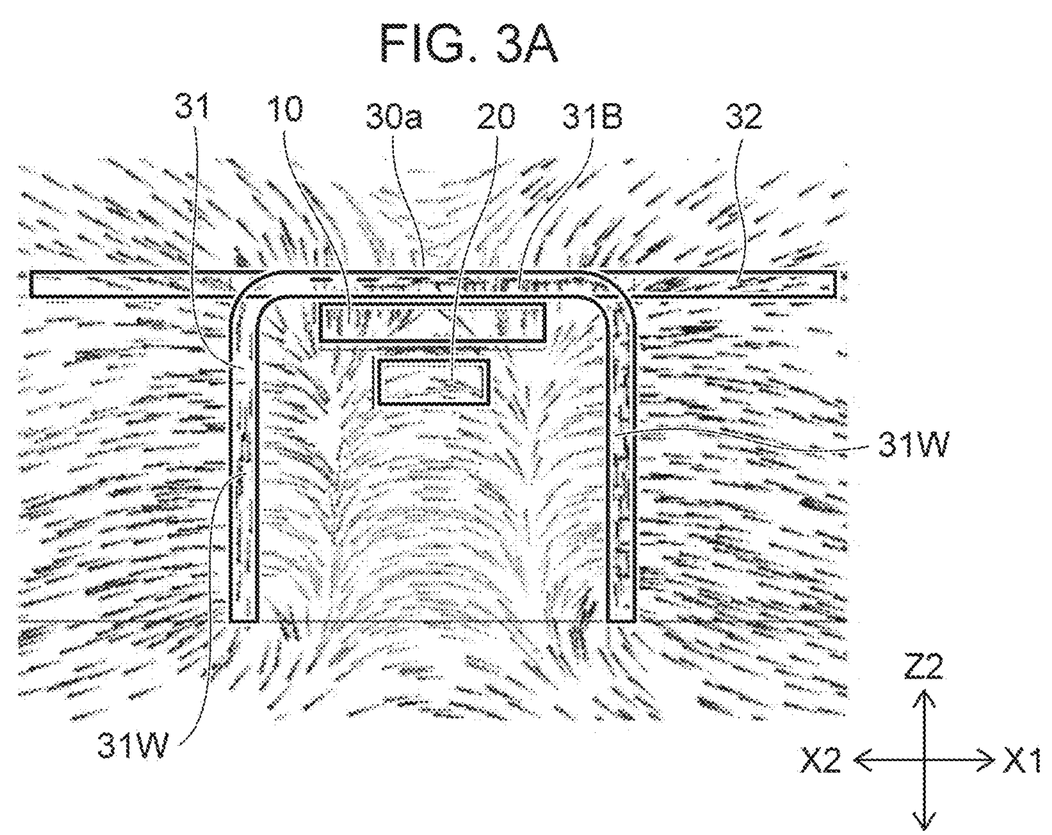
FIG. 3A illustrates a simulation result for confirmation of a shield effect of the magnetic shield included in the current sensor in the first embodiment of the present invention when viewed along the Y1-Y2 direction (first direction)
FIG. 3B illustrates the simulation result for confirmation of the shield effect of the magnetic shield included in the current sensor in the first embodiment of the present invention when viewed along the Z1-Z2 direction (third direction)

FIG. 3A illustrates a simulation result for confirmation of a shield effect of the magnetic shield included in the current sensor in the first embodiment of the present invention when viewed along the Y1-Y2 direction (first direction). FIG. 3B illustrates the simulation result for confirmation of the shield effect of the magnetic shield included in the current sensor in the first embodiment of the present invention when viewed along the Z1-22 direction (third direction). With a magnetic shield 30*a* illustrated in FIGS. 3A and 3B, the U-shaped portion 31 is formed from a single metal plate; the side wall 31W is longer than the side wall 31W of the magnetic shield 30 illustrated in FIGS. 1A and 1B; and the magnetic sensor 20 is positioned between the two side walls 31W when viewed along the first direction (Y1-Y2 direction).

Figure 4A:
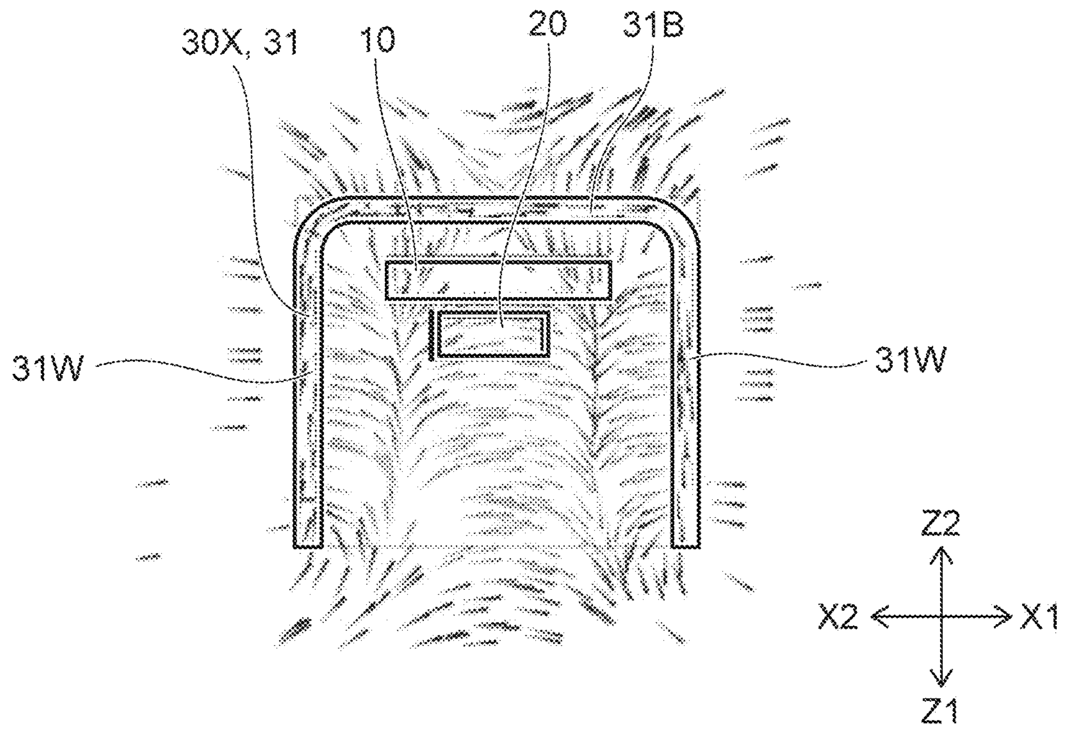
FIG. 4A illustrates a simulation result for confirmation of a shield effect of a magnetic shield included in a current sensor in a conventional technology when viewed along the Y1-Y2 direction (first direction)
Figure 4B:
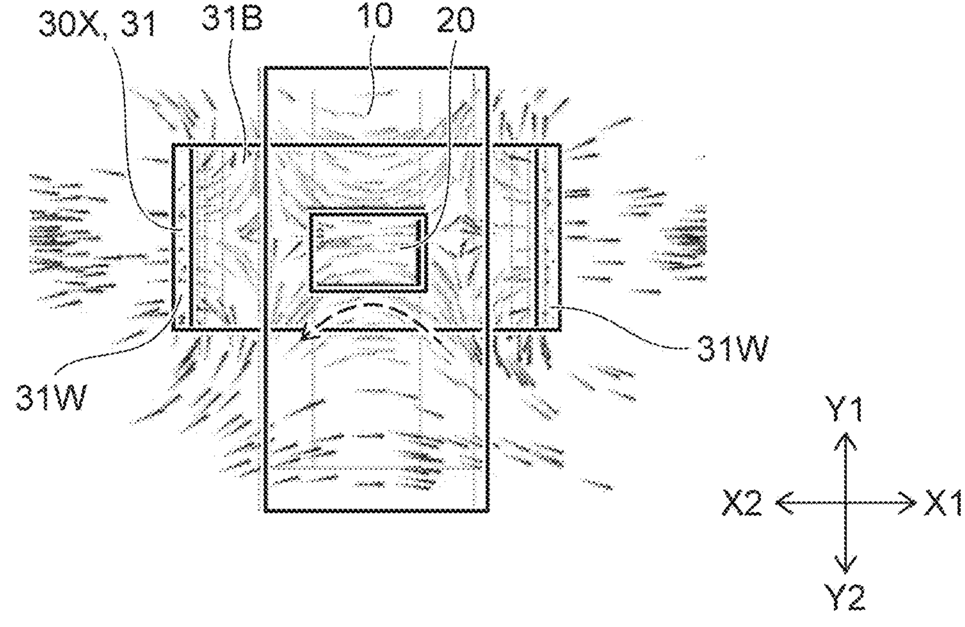
FIG. 4B illustrates the simulation result for confirmation of the shield effect of the magnetic shield included in the current sensor in the conventional technology when viewed along the Z1-22 direction (third direction)

FIG. 4A illustrates a simulation result for confirmation of a shield effect of a magnetic shield included in a current sensor in a conventional technology when viewed along the Y1-Y2 direction (first direction). FIG. 4B illustrates the simulation result for confirmation of the shield effect of the magnetic shield included in the current sensor in the conventional technology when viewed along the Z1-22 direction (third direction). A magnetic shield 30X illustrated in FIGS. 4A and 4B lacks the link portion 33 and attachment portion 32, which are disposed in the magnetic shield 30*a* illustrated in FIGS. 3A and 3B. The magnetic shield 30X has a structure in which the whole of the magnetic sensor 30X is composed of only the U-shaped portion 31.

A plurality of arrows illustrated in FIGS. 3A and 3B, which indicate simulation results, indicate orientations at individual positions in an external magnetic field. Different basic models were used in simulation for simulation results in FIGS. 3A and 3B and simulation for simulation results in FIGS. 4A and 4B, so a density at which arrows indicating the simulation result are placed differs. However, the orientation of a magnetic flux and its strength (magnetic flux density) can be compared.

In the magnetic shield 30*a*, the external magnetic field oriented from the X1 side in the X1-X2 direction toward the X2 side in the X1-X2 direction was attenuated by the two side walls 31W erected toward the Z1 side in the Z1-22 direction, as illustrated in FIGS. 3A and 3B. Since the attachment portion 32, the permeability of which is high, is adjacent to the U-shaped portion 31, the magnetic field flowing between the two side walls 31W of the U-shaped portion 31 tended to flow in the attachment portion 32 with a higher priority than in the air. That is, part of the magnetic field flowing between the two side walls 31W was drawn by the attachment portion 32.

Thus, with the magnetic shield 30*a*, less external magnetic field bypassed the side wall 31W and flowed into the area in which the magnetic sensor 20 is positioned. With the magnetic shield 30X, however, relatively much external magnetic field flows. In response to this, a comparison was made for the area, between the two side walls 31W, on the Y2 side of the magnetic sensor 20 in the Y1-Y2 direction. In the simulation result, illustrated in FIG. 3B, for the magnetic shield 30*a*, the amount of entrance of the external magnetic field was smaller than in the simulation result, illustrated in FIG. 4B, for the magnetic shield 30X (see the dashed arrows).

Since, as described above, the amount of entrance of the external magnetic field was smaller in the magnetic shield 30*a*, the density of the magnetic flux passing through the magnetic sensor 20 was smaller in the magnetic shield 30*a*. Specifically, in this simulation, in which the magnetic flux density of the applied external magnetic field was 500 μT, the magnetic flux density passing through the magnetic sensor 20 in the magnetic shield 30X (FIGS. 4A and 4B) was about 100 T. In contrast, the magnetic flux density passing through the magnetic sensor 20 in the magnetic shield 30*a* (FIGS. 3A and 3B) was about 30 μT. FIGS. 3A to 4B, which were originally in colors, are indicated in monochrome, so the brightness of the arrows does not represent the strength of the magnetic flux density.

To effectively use the external magnetic field attenuation function included in the attachment portion 32, it is preferable for the attachment portion 32 to be placed in the vicinity of a noise generation source. That is, it is preferable for the attachment portion 32 to be placed so as to be positioned between the U-shaped portion 31 and the noise generation source.

Second Embodiment

Figure 5:
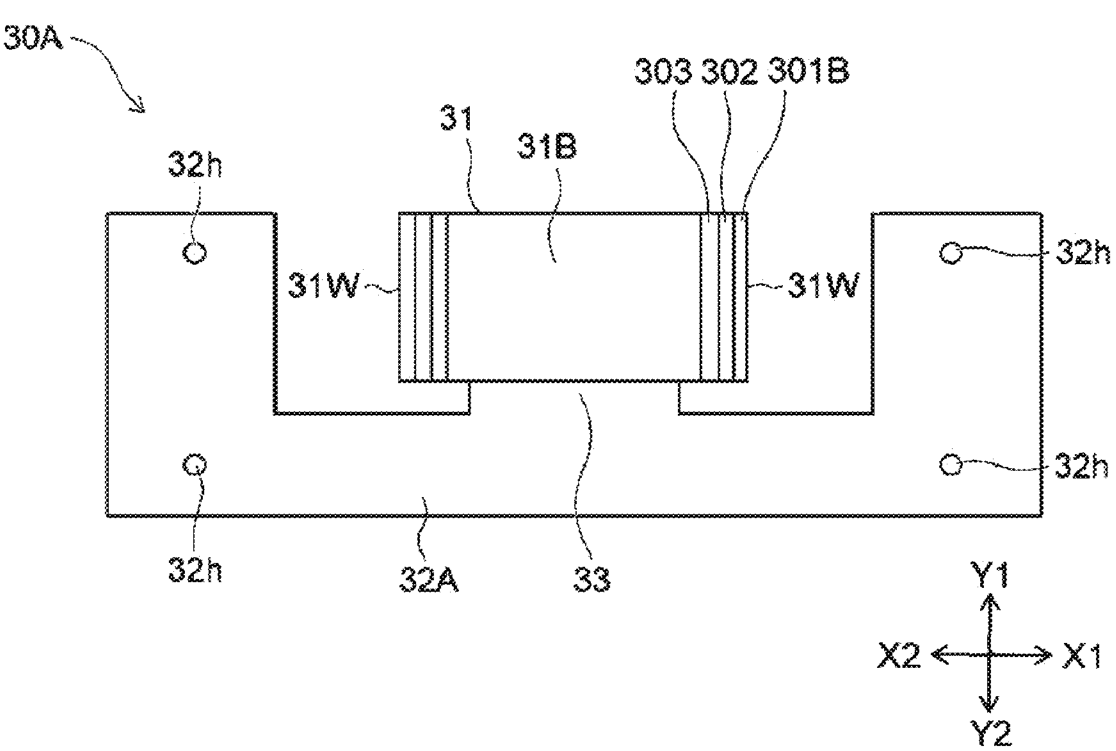
FIG. 5 illustrates a magnetic shield included in a current sensor in a second embodiment of the present invention when viewed along the Z1-22 direction (third direction)

FIG. 5 illustrates a magnetic shield included in a current sensor in a second embodiment of the present invention when viewed along the Z1-22 direction (third direction). The current sensor in the second embodiment of the present invention is basically the same as the current sensor 100 in the first embodiment, except a magnetic shield 30A. Therefore, only the magnetic shield 30A will be described and descriptions of other elements in the structure will be omitted.

With the magnetic shield 30A in the current sensor in the second embodiment of the present invention, a metal plate 301A is used instead of the metal plate 301 used in the magnetic shield 30 in the current sensor 100 in the first embodiment, so the shape of an attachment portion 32A differs. Specifically, the attachment portion 32A of the magnetic shield 30A further extends toward the Y1 side in the Y1-Y2 direction at both ends of the attachment portion 32 of the magnetic shield 30 in the second direction (X1-X2 direction), and has four through-holes 32*h* (two more than the number of through-holes 32*h* in the first embodiment). Since the attachment portion 32A has more through-holes 32*h*, the attachment portion 32A of the magnetic shield 30A is stably fixed to the case 40. That is, this means that measurement precision in the current sensor in the second embodiment can be more enhanced than the current sensor 100 in the first embodiment.

Before the metal plate 301A is bent to form the U-shaped portion 31, the metal plate 301A has a rectangular shape in which the ends, in the X1-X2 direction, of a portion intended to form the U-shaped portion 31, are placed so as to be brought close to portions of the attachment portion 32A, the portions further extending toward the Y1 side in the Y1-Y2 direction, as with the metal plate 301 in the magnetic shield 30 (see FIG. 2B). The link portion 33 is formed with the same width and the same length as the amount of cutting to form the outside shape of the U-shaped portion 31 from the metal plate 301A. That is, waste of materials is small when the metal plate 301A is machined.

Third Embodiment

Figure 6:
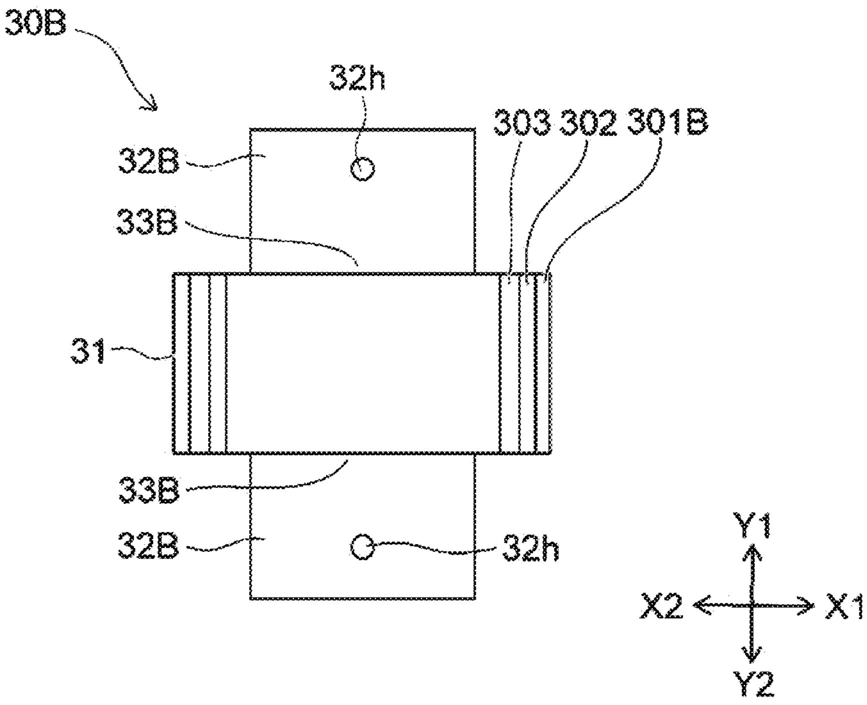
FIG. 6 illustrates a magnetic shield included in a current sensor in a third embodiment of the present invention when viewed along the Z1-Z2 direction (third direction)

FIG. 6 illustrates a magnetic shield included in a current sensor in a third embodiment of the present invention when viewed along the Z1-22 direction (third direction). The current sensor in the third embodiment of the present invention is basically the same as the current sensor 100 in the first embodiment, except a magnetic shield 30B. Therefore, only the magnetic shield 30B will be described and descriptions of other elements in the structure will be omitted.

With the magnetic shield 30B in the current sensor in the third embodiment of the present invention, a metal plate 301B is used instead of the metal plate 301 used in the magnetic shield 30 in the current sensor 100 in the first embodiment, so shapes other than the shape of the U-shaped portion 31 differ. Specifically, with the magnetic shield 30, the link portion 33 has been disposed at the end of the bottom wall 31B on the Y2 side in the Y1-Y2 direction. With the magnetic shield 30B, however, link portions 33B are disposed at both ends of the bottom wall 31B in the Y1-Y2 direction. Along with this, attachment portions 32B are disposed at both ends of the bottom wall 31B in the first direction (Y1-Y2 direction).

As described above with reference to FIG. 3A to 4B, the attachment portion 32 has the external magnetic field attenuation function. Therefore, since the attachment portions 32B are positioned at both ends in the first direction (Y1-Y2 direction), which is the direction in which the bus bar 10 extends, the portion in which the magnetic sensor 20 is disposed is less likely to be affected by the external magnetic field.

Fourth Embodiment

Figure 7A:
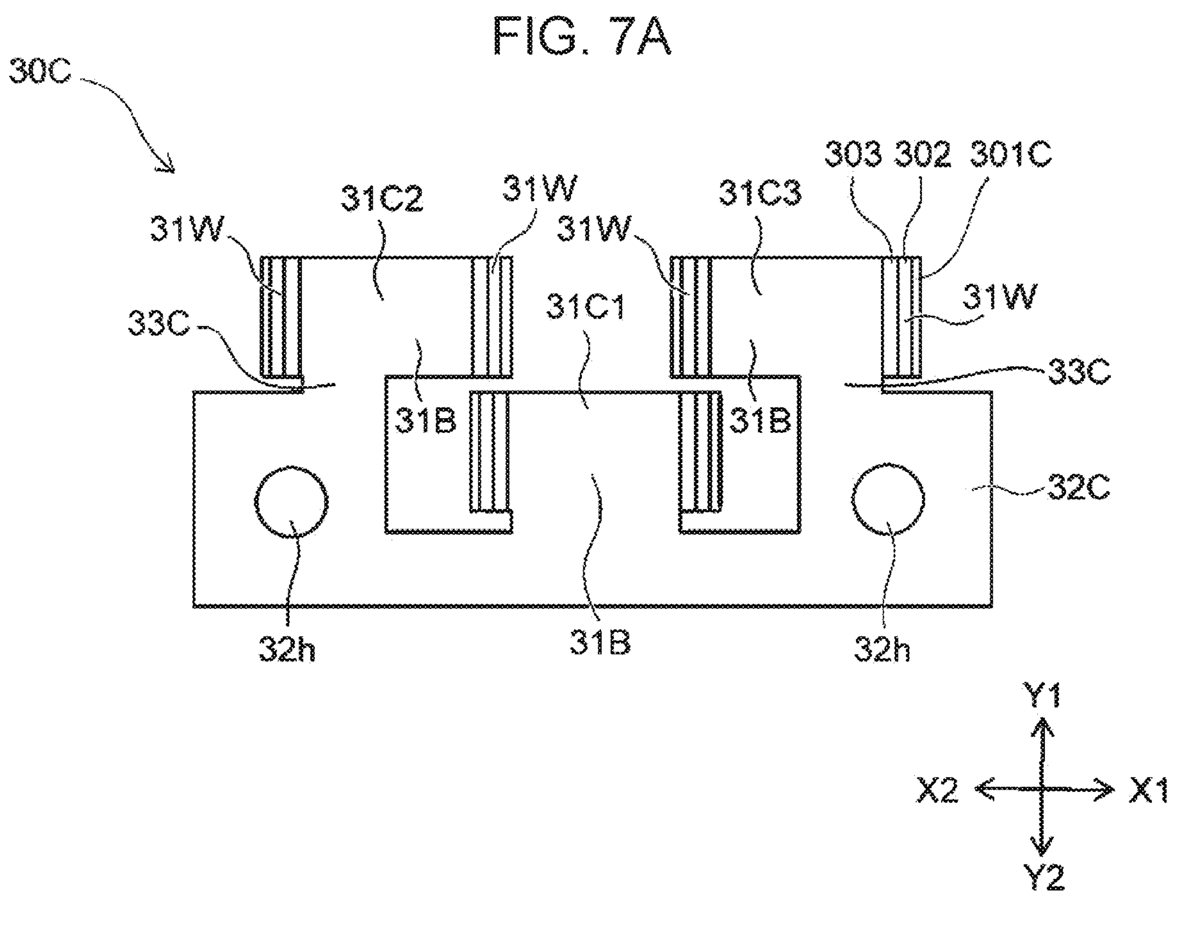
FIG. 7A illustrates a magnetic shield included in a current sensor in a fourth embodiment of the present invention when viewed along the Z1-22 direction (third direction)
Figure 7B:
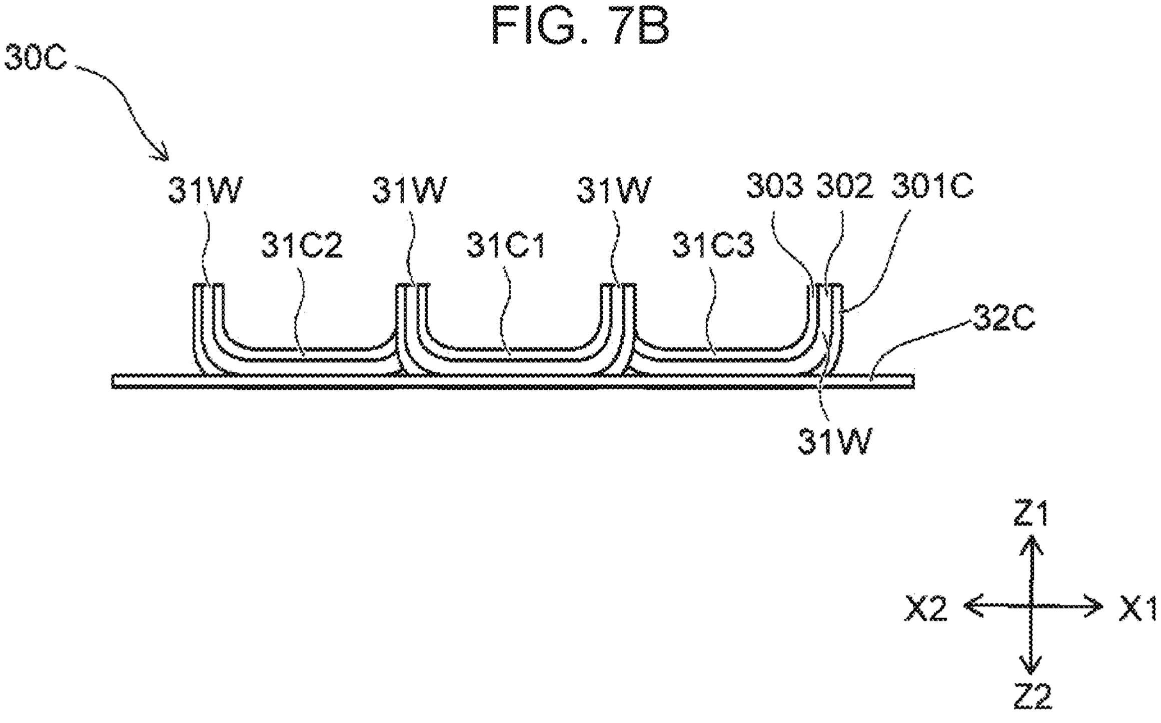
FIG. 7B illustrates the magnetic shield included in the current sensor in the fourth embodiment of the present invention when viewed along the Y1-Y2 direction (first direction)
Figure 7C:
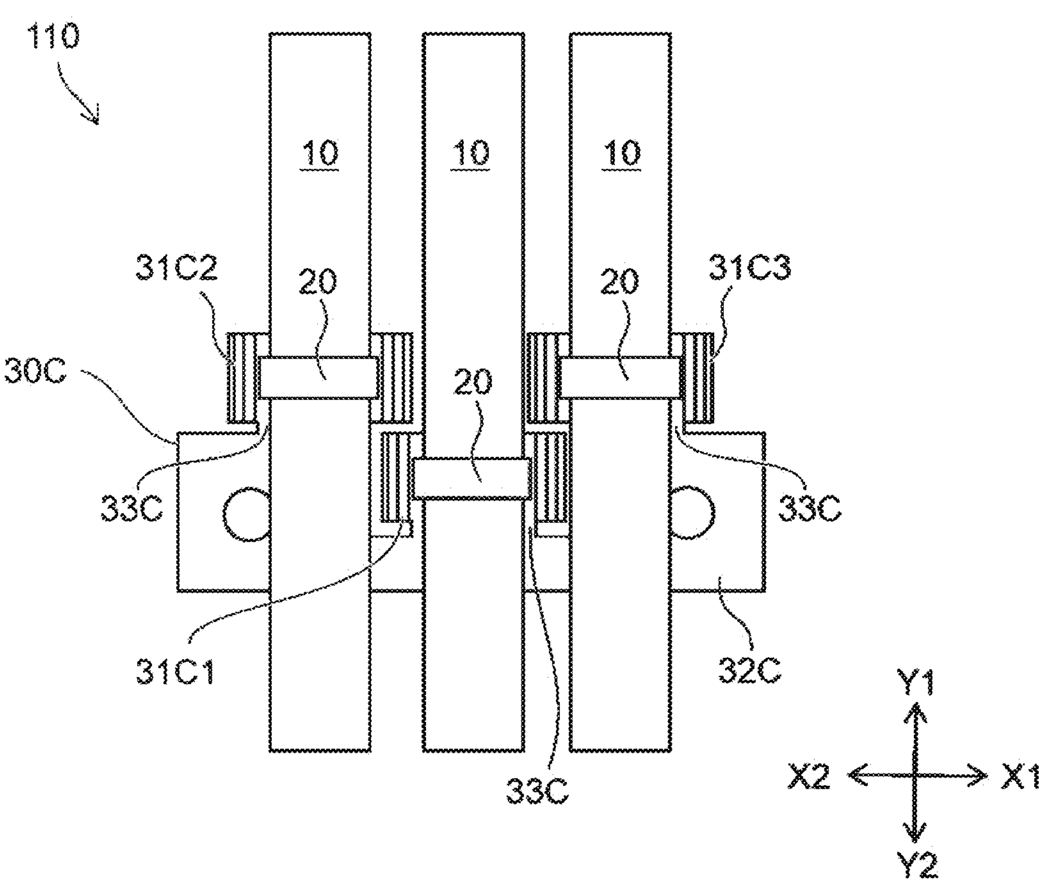
FIG. 7C illustrates the current sensor included in the fourth embodiment of the present invention when viewed along the Z1-22 direction (third direction)

FIG. 7A illustrates a magnetic shield included in a current sensor in a fourth embodiment of the present invention when viewed along the Z1-22 direction (third direction). FIG. 7B illustrates the magnetic shield included in the current sensor in the fourth embodiment of the present invention when viewed along the Y1-Y2 direction (first direction). FIG. 7C illustrates the current sensor in the fourth embodiment of the present invention when viewed along the Z1-22 direction (third direction). The current sensor 110 in the fourth embodiment of the present invention is basically the same as the current sensor 100 in the first embodiment, except a magnetic shield 30C. Therefore, only the magnetic shield 30C will be described and descriptions of other elements in the structure will be omitted or simplified. In FIG. 7C, placement of only the bus bar 10, magnetic sensor 20, and magnetic shield 30C is illustrated.

In the current sensor 110 in the fourth embodiment of the present invention, a plurality of bus bars 10 (specifically, three bus bars 10) may be disposed side by side in the case 40 in the second direction (X1-X2 direction). The magnetic shield 30C may have three U-shaped portions 31C1, 31C2, and 31C3 in correspondence to the three bus bars 10. These three U-shaped portions 31C1, 31C2, and 31C3 may be adjoined to an attachment portion 32C shared by them, through their respective link portions 33C.

A plurality of U-shaped portions 31C1, 31C2, and 31C3 are adjoined to a single attachment portion 32C. When the attachment portion 32C is positioned, therefore, the plurality of U-shaped portions 31C1, 31C2, and 31C3 can be accurately positioned concurrently. The plurality of U-shaped portions 31C1, 31C2, and 31C3 are integrated together through the attachment portion 32C, so relative positional deviations of the plurality of U-shaped portions 31C1, 31C2, and 31C3 are less likely to occur. Furthermore, the plurality of U-shaped portions 31C1, 31C2, and 31C3 can be attached in a single attachment process. This is also advantageous from the viewpoint of productivity.

Of the three U-shaped portions 31C1, 31C2, and 31C3 arranged in the second direction (X1-X2 direction), the U-shaped portion 31C2 at the center may be more on the Y2 side in the Y1-Y2 direction than are the remaining two U-shaped portions 31C1 and 31C3 at both ends, as illustrated in FIG. 7A. That is, the three U-shaped portions 31C1, 31C2, and 31C3 may be placed in a so-called staggered arrangement. Thus, as illustrated in FIG. 7B, when viewed along the first direction (Y1-Y2 direction), the side wall 31W of the U-shaped portion 31C1 on the X1 side in the X1-X2 direction may be overlaid on the side wall 31W of the U-shaped portion 31C3 on the X2 side in the X1-X2 direction, the U-shaped portion 31C3 being positioned on the X1 side of the U-shaped portion 31C1 in the X1-X2 direction; and the side wall 31W of the U-shaped portion 31C1 on the X2 side in the X1-X2 direction may be overlaid on the side wall 31W of the U-shaped portion 31C2 on the X1 side in the X1-X2 direction, the U-shaped portion 31C2 being positioned on the X2 side of the U-shaped portion 31C1 in the X1-X2 direction. Since the three U-shaped portions 31C1, 31C2, and 31C3 are placed like this, spacing between adjacent bus bars 10 can be narrowed as illustrated in FIG. 7C and downsizing of the current sensor 110 in the Y1-Y2 direction is implemented.

As illustrated in FIG. 7B, the magnetic shield 30C has three metal plates 301C, 302, and 303, and the metal plate 301C forms part of the three U-shaped portions 31C1, 31C2, and 31C3, three link portions 33C, and attachment portion 32C. Two metal plates 302 and 303 are placed so as to be overlaid on the metal plate 301C, which forms part of the U-shaped portion 31C1. Each of the three U-shaped portions 31C1, 31C2, and 31C3 is a multi-layer body of these metal plates 301C, 302, and 303.

Figure 8A:
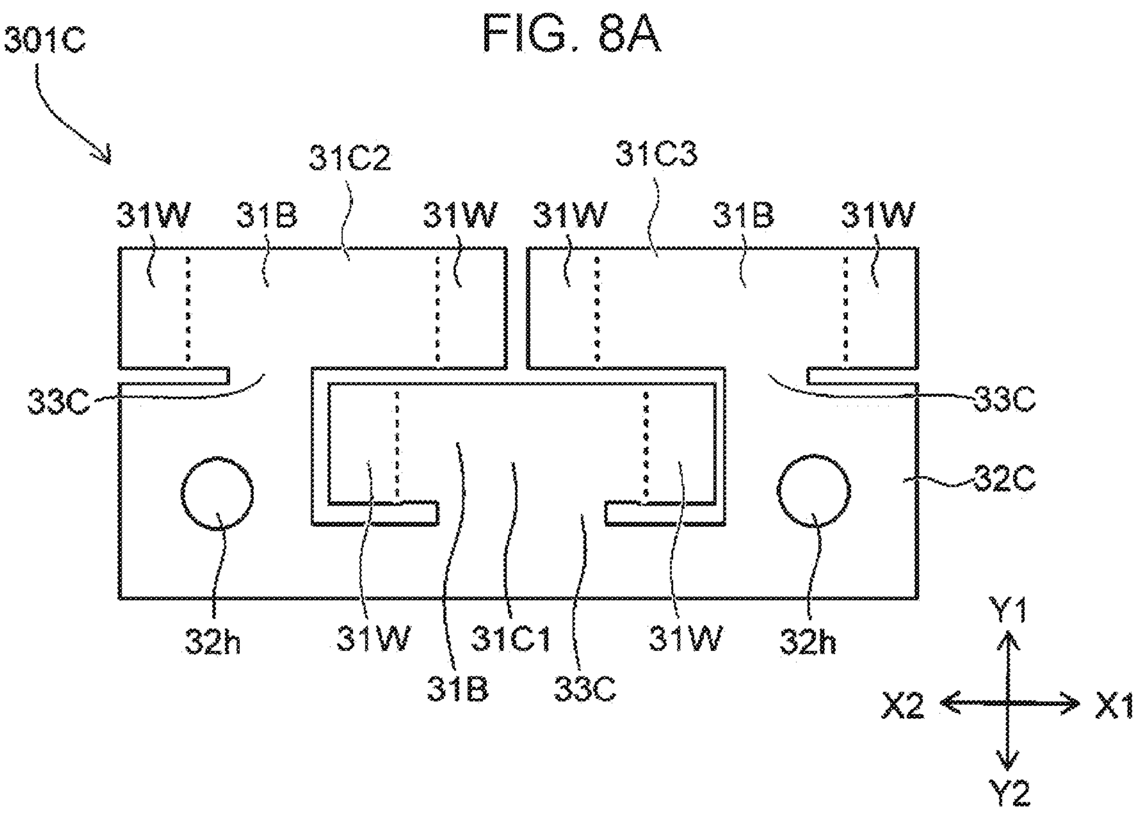
FIG. 8A illustrates a method of manufacturing part of the magnetic shield included in the current sensor in the fourth embodiment of the present invention has (before bending)
Figure 8B:
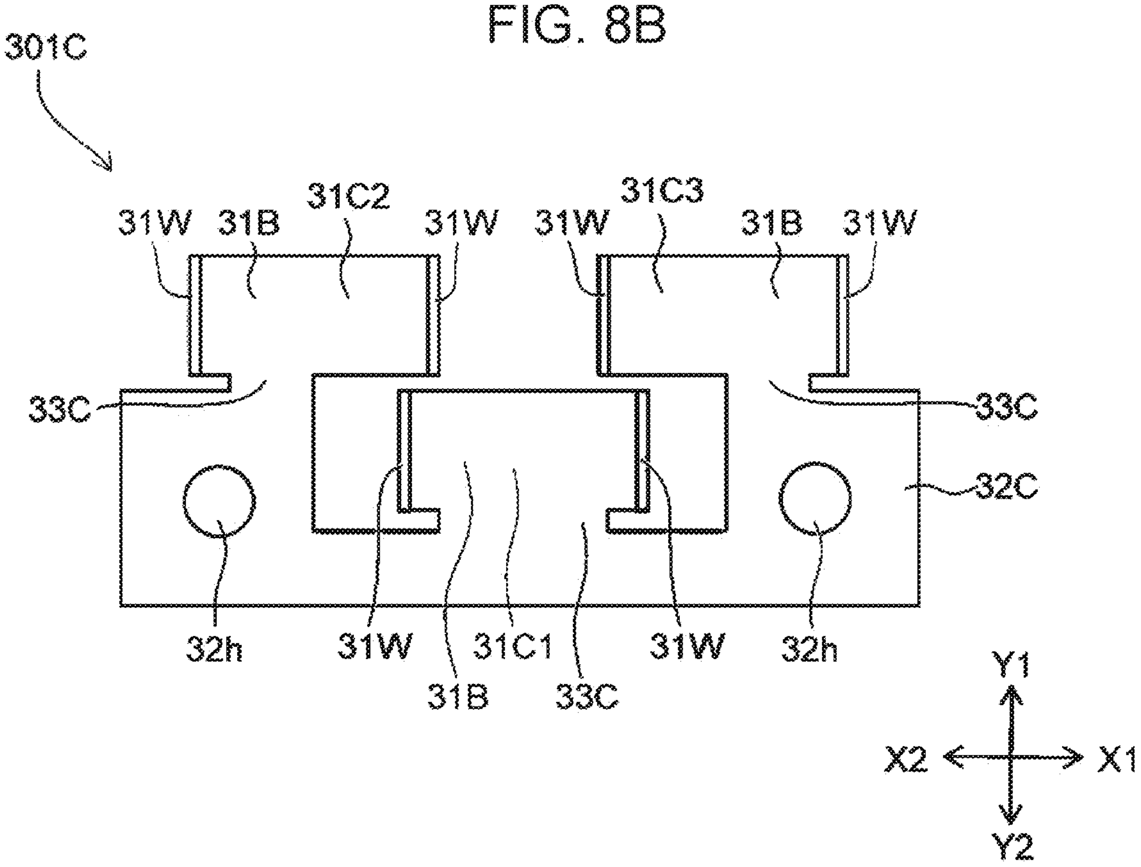
FIG. 8B illustrates the method of manufacturing part of the magnetic shield included in the current sensor in the fourth embodiment of the present invention (after bending) when viewed along the Z1-22 direction (third direction)
Figure 8C:
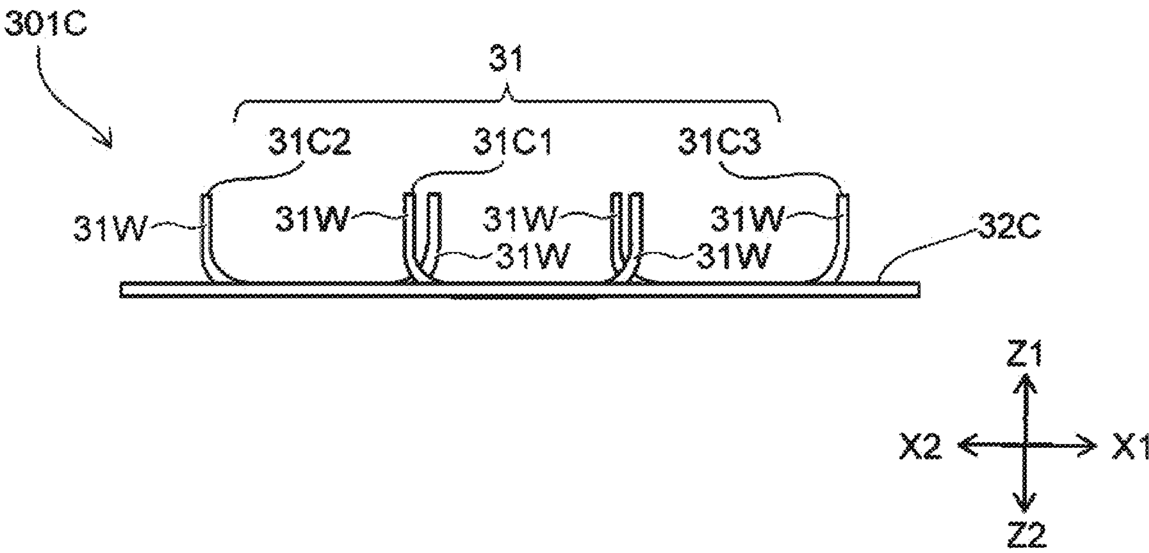
FIG. 8C illustrates the method of manufacturing part of the magnetic shield included in the current sensor in the fourth embodiment of the present invention (after bending) when viewed along the Y1-Y2 direction (first direction)

FIG. 8A illustrates a method of manufacturing part of the magnetic shield included in the current sensor in the fourth embodiment of the present invention (before bending). FIG. 8B illustrates the method of manufacturing part of the magnetic shield included in the current sensor in the fourth embodiment of the present invention (after bending) when viewed along the Z1-22 direction (third direction). FIG. 8C illustrates the method of manufacturing part of the magnetic shield included in the current sensor in the fourth embodiment of the present invention (after bending) when viewed along the Y1-Y2 direction (first direction).

Before the U-shaped portions 31C1, 31C2, and 31C3 undergo shape machining, the whole of the metal plate 301C is in a flat plate shape. As illustrated in FIG. 8A, there is spacing formed by stamping between the U-shaped portion 31C1 and the U-shaped portion 31C2, between the U-shaped portion 31C1 and the U-shaped portion 31C3, between the U-shaped portion 31C2 and the attachment portion 32C, and between the U-shaped portion 31C3 and the attachment portion 32C. Thus, three link portions 33C, positioned between the attachment portion 32 and the U-shaped portions 31C1, 31C2, and 31C3, are formed. Since there is spacing like this, in other words, since the link portions 33C are provided, when a portion intended to form the side walls 31W is erected in bending, which is a next process, the possibility is reduced that the portion intended to form the side wall 31W interferes with another portion positioned in the vicinity, so the portion intended to from the side wall 31W is not appropriately erected or an unpredictable deformation occurs in the other portion in the vicinity.

Before the metal plate 301C is bent to form the U-shaped portions 31C1, 31C2, and 31C3, the end of a portion that is part of the U-shaped portion 31C2 on the X2 side in the X1-X2 direction and is intended to form the side wall 31W on the X2 side in the X1-X2 direction and the end of the attachment portion 32C on the X2 side in the X1-X2 direction are at the same position in the X1-X2 direction, as with the metal plate 301 of the magnetic shield 30 and the metal plate 301A of the magnetic shield 30A, which have been described above. Similarly, the end of a portion that is part of the U-shaped portion 31C3 on the X1 side in the X1-X2 direction and is intended to form the side wall 31W on the X1 side in the X1-X2 direction and the end of the attachment portion 32C on the X1 side in the X1-X2 direction are at the same position in the X1-X2 direction. The U-shaped portions 31C1, 31C2, and 31C3 are linked to the attachment portion 32C shared by them through the link portions 33C, instead of individually providing the attachment portion 32C in correspondence to each of the U-shaped portions 31C1 to 31C3. Therefore, waste of materials is small when the metal plate 301C is machined.

When bending is performed, the portion forming the side wall 31W is erected in the third direction, as illustrated in FIGS. 8B and 8C. After the portion forming the side wall 31W and the portion forming the bottom wall 31B are formed in this way, the U-shaped portions 31C1, 31C2, and 31C3, each of which is composed of a multi-layer body, is formed by sequentially laminating the metal plates 302 and 303, which have similarly undergone bending, completing the manufacturing of the magnetic shield 30C.

Figure 9:
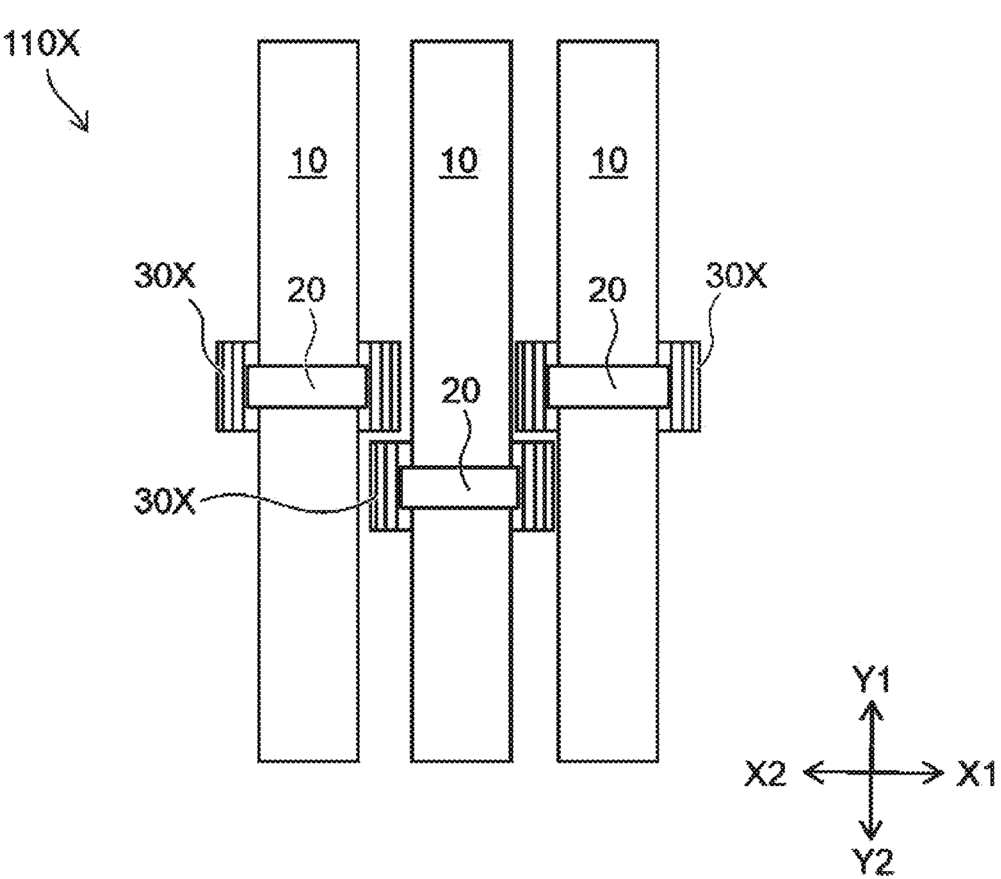
FIG. 9 illustrates the current sensor in the conventional technology when viewed along the Z1-22 direction (third direction), in correspondence to the current sensor in the fourth embodiment of the present invention.

FIG. 9 illustrates the current sensor in the conventional technology when viewed along the Z1-22 direction (third direction), in correspondence to the current sensor in the fourth embodiment of the present invention. In the current sensor 110X illustrated in FIG. 9, three magnetic shields 30X, each of which is composed of the U-shaped portion 31 without the attachment portion 32 and link portion 33, are placed in a staggered arrangement, as with the three U-shaped portions 31C1, 31C2, and 31C3 of the magnetic shield 30C in the current sensor 110 in the fourth embodiment of the present invention. A result of measuring the effect of an external magnetic field on the current sensor 110X indicated 1.8% of the intensity of the external magnetic field. In contrast to this, as for the current sensor 110 in the fourth embodiment of the present invention, a result of measuring the effect of a similar external magnetic field indicated 0.8% of the intensity of the external magnetic field. That is, the effect of the intensity of the external magnetic field became ½ or less.

In further quantitative study, a measurement error of a maximum of 18 A will occur in the current sensor 110X when the rating is 1000 A. However, measurement error in the current sensor 110 will be 8 A. The difference is 10 A. Even when the rating is 1000 A, a current range usually used is from about 100 A to about 200 A. Therefore, when an abnormal state is assumed in which a current at the rating flows in a bus bar 10 adjacent to a bus bar 10 used in this usual current range, error based on the external magnetic field is about 10% to about 20% in the case of the current sensor 110X. However, error is about 5% to about 10% in the case of the current sensor 110. When the current sensor is applied to an electric vehicle, 5% to 10%, which are differences in the above error, are large values that cannot be ignored when a driving range (electricity consumption) per unit electric energy is calculated per unit electric energy.

Fifth Embodiment

Figure 10A:
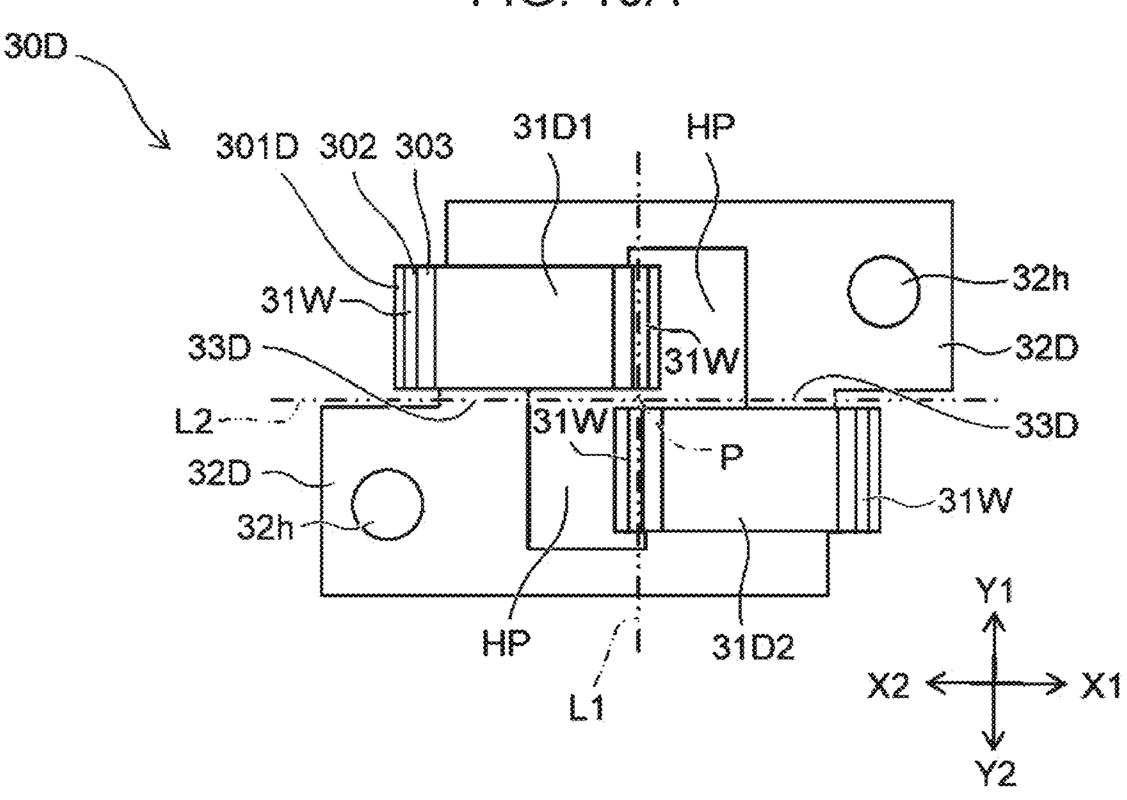
FIG. 10A illustrates a magnetic shield included in a current sensor in a fifth embodiment of the present invention when viewed along the Z1-22 direction (third direction)
Figure 10B:
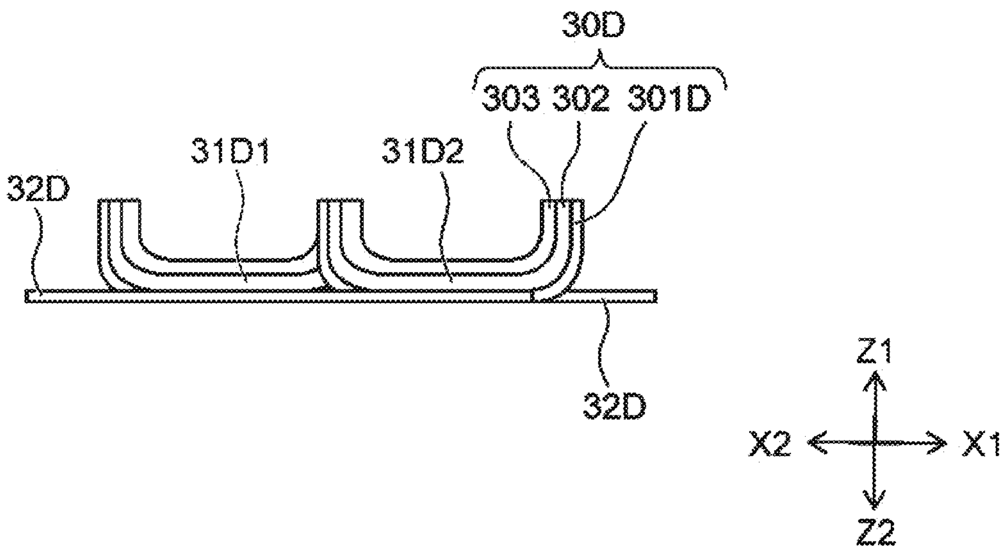
FIG. 10B illustrates the magnetic shield included in the current sensor in the fifth embodiment of the present invention when viewed along the Y1-Y2 direction (first direction)

FIG. 10A illustrates a magnetic shield included in a current sensor in a fifth embodiment of the present invention when viewed along the Z1-22 direction (third direction). FIG. 10B illustrates the magnetic shield included in the current sensor in the fifth embodiment of the present invention when viewed along the Y1-Y2 direction (first direction). The current sensor in the fifth embodiment of the present invention is basically the same as the current sensor 100 in the first embodiment, except a magnetic shield 30D. Therefore, only the magnetic shield 30D will be described and descriptions of other elements in the structure will be omitted.

The magnetic shield 30D illustrated in FIGS. 10A and 10B has two U-shaped portions 31D1 and 31D2. The U-shaped portion 31D1 has a link portion 33D at an end of the bottom wall 31B on the Y2 side in the first direction (Y1-Y2 direction). Similarly, the U-shaped portion 31D2 has another link portion 33D at an end of the bottom wall 31B on the Y1 side in the first direction (Y1-Y2 direction). As a result, an attachment portion 32D extends at an end of the U-shaped portion 31D1 on the Y2 side in the first direction (Y1-Y2 direction). Similarly, another attachment portion 32D extends at an end of the U-shaped portion 31D2 on the Y1 side in the first direction (Y1-Y2 direction).

In addition, as for the metal plate 301D forming part of the U-shaped portions 31D1 and 31D2, the link portions 33D, and attachment portions 32D, the side walls 31W can be formed by stamping and bending a flat plate, as with the magnetic shield 30C in the fourth embodiment. By bending a metal plate that was at the position of a hollow HP on the X1 side of the U-shaped portion 31D1 in the X1-X2 direction, part of the side wall 31W of the U-shaped portion 31D1 on the X1 side in the X1-X2 direction is formed. Similarly, by bending a metal plate that was at the position of a hollow HP on the X2 side of the U-shaped portion 31D2 in the X1-X2 direction, part of the side wall 31W of the U-shaped portion 31D2 on the X2 side in the X1-X2 direction is formed.

Furthermore, the magnetic shield 30D has a point-symmetric shape when viewed along the third direction (Z1-22 direction), as illustrated in FIG. 10A. Specifically, the two U-shaped portions 31D1 and 31D2, two attachment portions 32D, and the like are placed at positions at which they become point-symmetric with respect to an intersection P, in FIG. 10A, of a virtual line L1, which bisects the magnetic shield 30D in the X1-X2 direction and a virtual line L2, which bisects the magnetic shield 30D in Y1-Y2 direction. When the magnetic shield 30D is superior in symmetry as described above, this may be advantageous from the viewpoint of productivity (efficiency in the manufacturing of the metal plate 301D, ease of shape machining, and ease of assembling). A specific example of this advantage is that the wrong attachment direction is less likely to be taken when the magnetic shield 30D is attached to a case (not illustrated).

Sixth Embodiment

Figure 11:
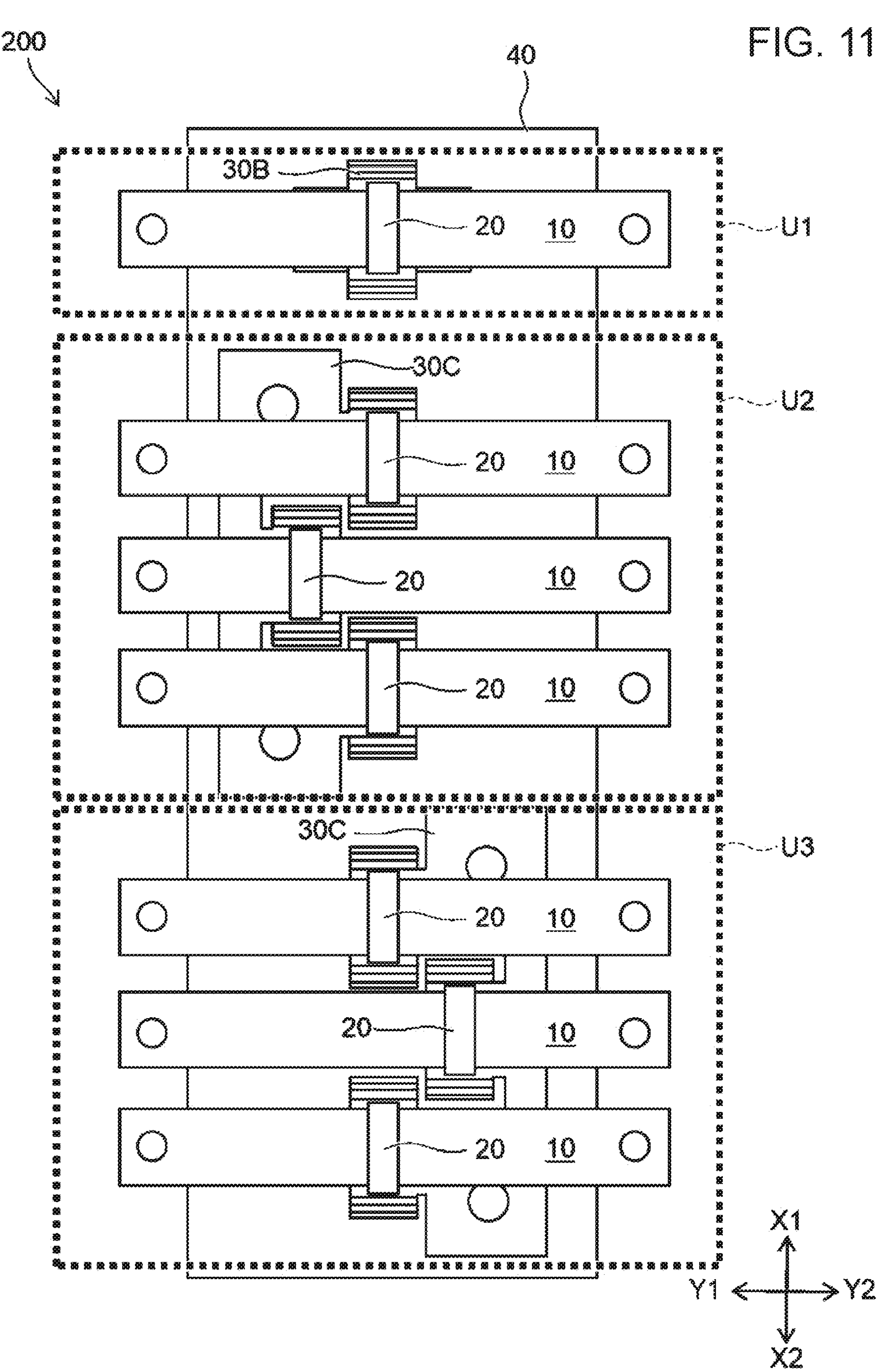
FIG. 11 illustrates a current sensor in a sixth embodiment of the present invention when viewed along the Z1-Z2 direction (third direction)

FIG. 11 illustrates a current sensor in a sixth embodiment of the present invention when viewed along the Z1-Z2 direction (third direction). The current sensor 200 in this embodiment has a plurality of bus bars 10 and a plurality of magnetic shields. Specifically, one magnetic shield 30B in the third embodiment and two magnetic shields 30C in the fourth embodiment are arranged side by side in the second direction (X1-X2 direction), as illustrated in FIG. 11.

When a plurality of magnetic shields are provided in correspondence to a plurality of bus bars 10 in one case 40 in this way, the current sensor 200 that can make measurements for many bus bars 10 can be easily formed.

When, in the current sensor 200, bus bars 10 having a common intended purpose correspond to the same magnetic shield, a measurement unit can be configured on a per magnetic shield basis. In a specific example in which the current sensor 200 is used in an electric car, a unit U1, which includes a magnetic shield 30B having one U-shaped portion 31, is used to detect a current in a step-up converter and a unit U2 and a unit U3, each of which includes a magnetic shield 30C having three U-shaped portions 31, are used to measure currents in different three-phase motors. In this type of structure, even when the amount of rated current differs between the three-phase motor under measurement by the unit U2 and the three-phase motor under measurement by the unit U3, it is possible to adapt to the respective amount of rated current with the magnetic shield 30C taken as a unit. Therefore, the current sensor 200 can be easily designed.

Seventh Embodiment

Figure 12A:
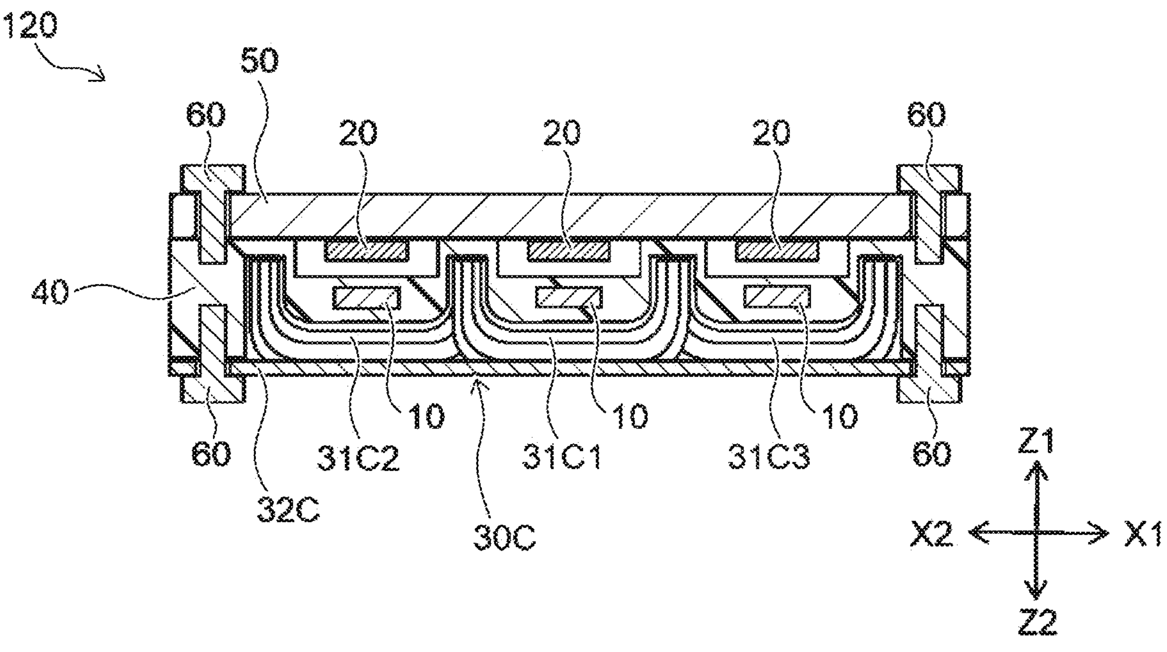
FIG. 12A illustrates a current sensor in a seventh embodiment of the present invention when viewed along the Y1-Y2 direction (first direction)
Figure 12B:
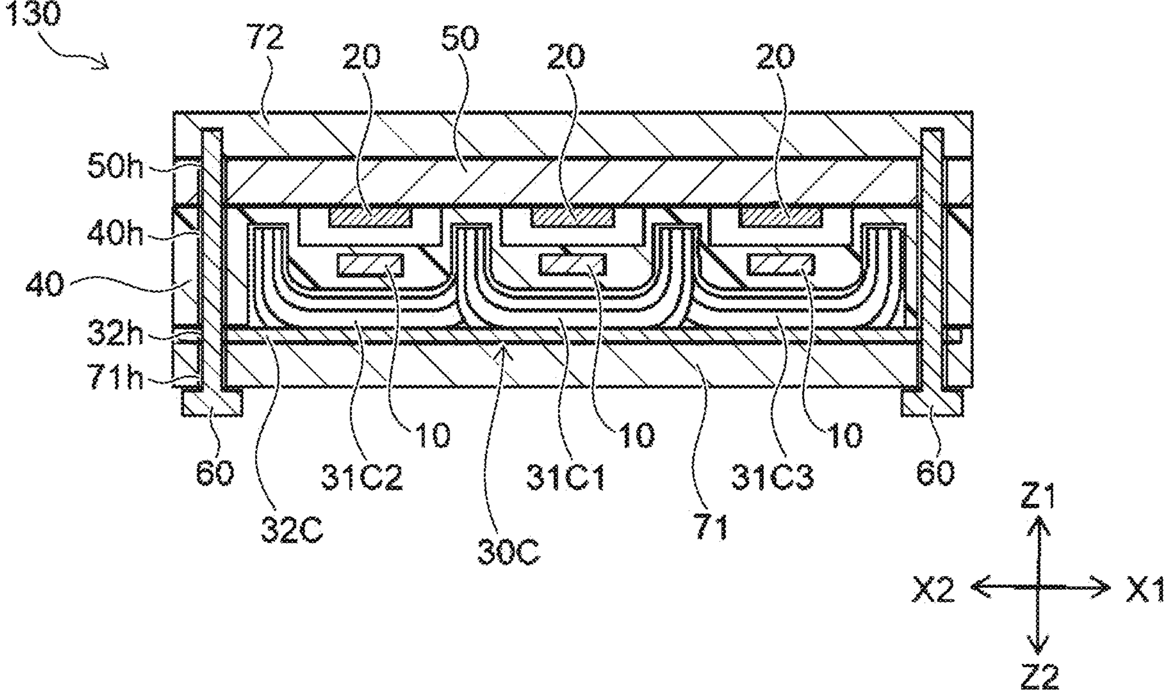
FIG. 12B illustrates a current sensor in a variation of the seventh embodiment of the present invention when viewed along the Y1-Y2 direction (first direction).

FIG. 12A illustrates a current sensor in a seventh embodiment of the present invention when viewed along the Y1-Y2 direction (first direction). FIG. 12B illustrates a current sensor in a variation of the seventh embodiment of the present invention when viewed along the Y1-Y2 direction (first direction).

Although the current sensor 120, illustrated in FIG. 12A, in the seventh embodiment differs from the current sensor 100, illustrated in FIG. 1A, in the first embodiment in that the magnetic shield 30C has three U-shaped portions 31, the basic structure is the same. Specifically, the fixing members 60 are passed through the through-holes 32*h* in the attachment portion 32 or the through-holes 50*h* in the substrate 50, and are then fixed to the case 40. With the current sensor 130, illustrated in FIG. 12B, in a variation of the seventh embodiment, however, a cover member 71 is provided on the lower side (Z2 side in the Z1-22 direction) of the attachment portion 32 and a cover member 72 is also provided on the upper side (Z1 side in the Z1-22 direction) of the substrate 50, unlike the current sensor 120 in the seventh embodiment. Since the whole of the attachment portion 32 is stored in a recess formed in the cover member 71, the magnetic shield 30C is not exposed to the outside.

With the current sensor 130 illustrated in FIG. 12B, through-holes 71*h* are formed in the cover member 71 and through-holes 40*h* are formed in the case 40. The fixing member 60 is passed through the through-hole 71*h* in the cover member 71, the through-hole 32*h* in the attachment portion 32, the through-hole 40*h* in the case 40, and the through-hole 50*h* in the substrate 50, from the lower side (Z2 side in the Z1-Z2 direction). Then, the end of the fixing member 60 is embedded in the cover member 72, fixing the positions of individual members constituting the current sensor 130.

Since the cover members 71 and 72 are disposed in this way, even if rust is caused from part (particularly, a broken surface) of the magnetic shield 30C, the rust does not spill out to the outside of the current sensor 130. This prevents the problem that the rust, which has spilled out to the outside, drops between wires and causes a short-circuit.

Embodiments have been described for easy understanding of the present invention and do not to limit the present invention. Therefore, each element disclosed in the above embodiments is intended to include all design changes and equivalents included in the technical range of the present invention.

For example, although, in the above embodiments, the link portion 33 is disposed at an end of the bottom wall 31B, the link portion 33 may be disposed on the side wall 31W. As a specific example in this modification, the link portion 33 may be disposed on the upper end (end on the Z1 side in the Z1-22 direction) of the side wall 31W and the attachment portion 32 may extend toward the outside in the second direction (X1-X2 direction).

What is claimed is:

1. A current sensor comprising, when three directions that are mutually orthogonal are a first direction, a second direction, and a third direction:

a bus bar extending in the first direction;

a magnetic shield having a portion that faces the bus bar along the third direction:

a magnetic sensor that faces the bus bar along the third direction on an opposite side of the bus bar to a side on which the magnetic shield is placed; and a case molded integrally with part of the bus bar; wherein the magnetic shield has a U-shaped portion that has a bottom wall including a portion that faces the bus bar along the third direction and also has two side walls that are erected in the third direction from ends of the bottom wall in the second direction and are placed so as to face each other in the second direction, an attachment portion that is adjoined to the U-shaped portion and is fixed to the case, and a link portion that links the U-shaped portion and the attachment portion together, the case has a storage recess, in which the U-shaped portion is stored but the magnetic sensor is not stored, and the magnetic shield is fixed to an outside surface of the case at the attachment portion in a state in which the U-shaped portion is inserted into the storage recess.

2. The current sensor according to claim 1, wherein the attachment portion is disposed from the link portion positioned at an end of the bottom wall of the U-shaped portion in the first direction.

3. The current sensor according to claim 1, wherein: a plurality of bus bars are disposed side by side in the case in the second direction; and the magnetic shield has a plurality of U-shaped portions in correspondence to the plurality of bus bars, and the plurality of U-shaped portions are adjoined to the attachment portion shared by the plurality of U-shaped portions.

4. The current sensor according to claim 3, wherein two U-shaped portions corresponding to two bus bars adjacent to each other are placed with an offset in the first direction.

5. The current sensor according to claim 4, wherein the two U-shaped portions corresponding to the two bus bars adjacent to each other partially overlap each other when viewed along the first direction.

6. The current sensor according to claim 1, wherein the attachment portion is formed from a soft magnetic body and is placed so as to be positioned between the U-shaped portion and a magnetic noise generation source.

7. The current sensor according to claim 1, wherein the attachment portion is formed from a soft magnetic body and is adjoined to each of both ends of the U-shaped portion in the first direction.

8. The current sensor according to claim 1, further comprising a cover, for the case, that abuts the case from the third direction.

9. The current sensor according to claim 1, wherein the magnetic shield is formed from a metal plate, and the side wall of the U-shaped portion is formed by bending part of the metal plate.

10. The current sensor according to claim 1, wherein the U-shaped portion is a multi-layer body in which a plurality of metal plates are laminated, and the attachment portion is linked to at least one of the plurality of metal plates through the link portion.

11. The current sensor according to claim 10, wherein the attachment portion is formed from one of the metal plates constituting the multi-layer body, the one being the most distant from the bus bar.

12. The current sensor according to claim 1, wherein:

the magnetic shield is one of a plurality of magnetic shields; and the plurality of magnetic shields are fixed to the case so that a plurality of bus bars corresponding to a plurality of U-shaped portions included in the plurality of magnetic shields are arranged side by side in the second direction.

* * * * *